(12) United States Patent
Corrigan

(10) Patent No.: US 6,943,415 B2
(45) Date of Patent: Sep. 13, 2005

(54) ARCHITECTURE FOR MASK PROGRAMMABLE DEVICES

(75) Inventor: Wilfred Corrigan, Los Altos Hills, CA (US)

(73) Assignee: LSI Logic Corporation, Milpitas, CA (US)

( * ) Notice: Subject to any disclaimer, the term of this patent is extended or adjusted under 35 U.S.C. 154(b) by 52 days.

(21) Appl. No.: 10/409,639

(22) Filed: Apr. 8, 2003

(65) Prior Publication Data

US 2004/0201098 A1 Oct. 14, 2004

(51) Int. Cl.[7] .......................... H01L 29/76; H01L 29/94; H01L 31/062; H01L 31/113; H01L 31/119
(52) U.S. Cl. ....................... 257/390; 257/202; 257/209; 257/391
(58) Field of Search ................................. 257/390, 202, 257/209, 391

(56) References Cited

U.S. PATENT DOCUMENTS

| 6,242,767 B1 | 6/2001 | How et al. | 257/202 |
| 6,509,209 B1 | 1/2003 | Shroff et al. | 438/131 |

OTHER PUBLICATIONS

Embattled gate array players pull out an ace; EE Times; http://www.eetimes.com/story/OEG20020318S0011; Jan. 30, 2003.

Instant Silicon Solution Platforms (ISSPs); NEC Electronics America, Inc.; http://www.necelam.com/ASIC/issp.cfm; Jan. 30, 2003.

The Easy Way to ASIC; Lightspeed Semiconductor; http://www.lightspeed.com/cat.html?cat_id=9.6; Jan. 30, 2003.

NEC Delivers New ASIC Device Platform for Mid–Volume Applications; NEC Global; http://www.nec.co.jp/press/en/0203/1801.html; Jan. 29, 2003.

The Easy Way to ASIC; Lightspeed Semiconductor; www.lightspeed.com; Jul. 2002.

*Primary Examiner*—Long Pham
(74) *Attorney, Agent, or Firm*—Suiter West PC LLO

(57) ABSTRACT

The present invention is directed to a semi-programmable ASIC using two metals for the metal layers. The semi-programmable ASIC may have a prefabricated first section and a customized second section. The prefabricated first section and the customized second section may each include one or more metal layers. The one or more metal layers included in the prefabricated first section may be used to define undifferentiated sets of electrical and logic elements. An undifferentiated set of electrical and logic elements may be a NAND logic gate, a NOR logic gate, or the like. The one or more metal layers included in the customized second section may be used to define logic functions of the undifferentiated sets of electrical and logic elements. The metal used in the one or more metal layers included in the prefabricated first section may be of one type such as copper, copper alloy, or the like, and the metal used in the metal layers included in the customized second section may be of another type such as aluminum, aluminum alloy, or the like.

18 Claims, 3 Drawing Sheets

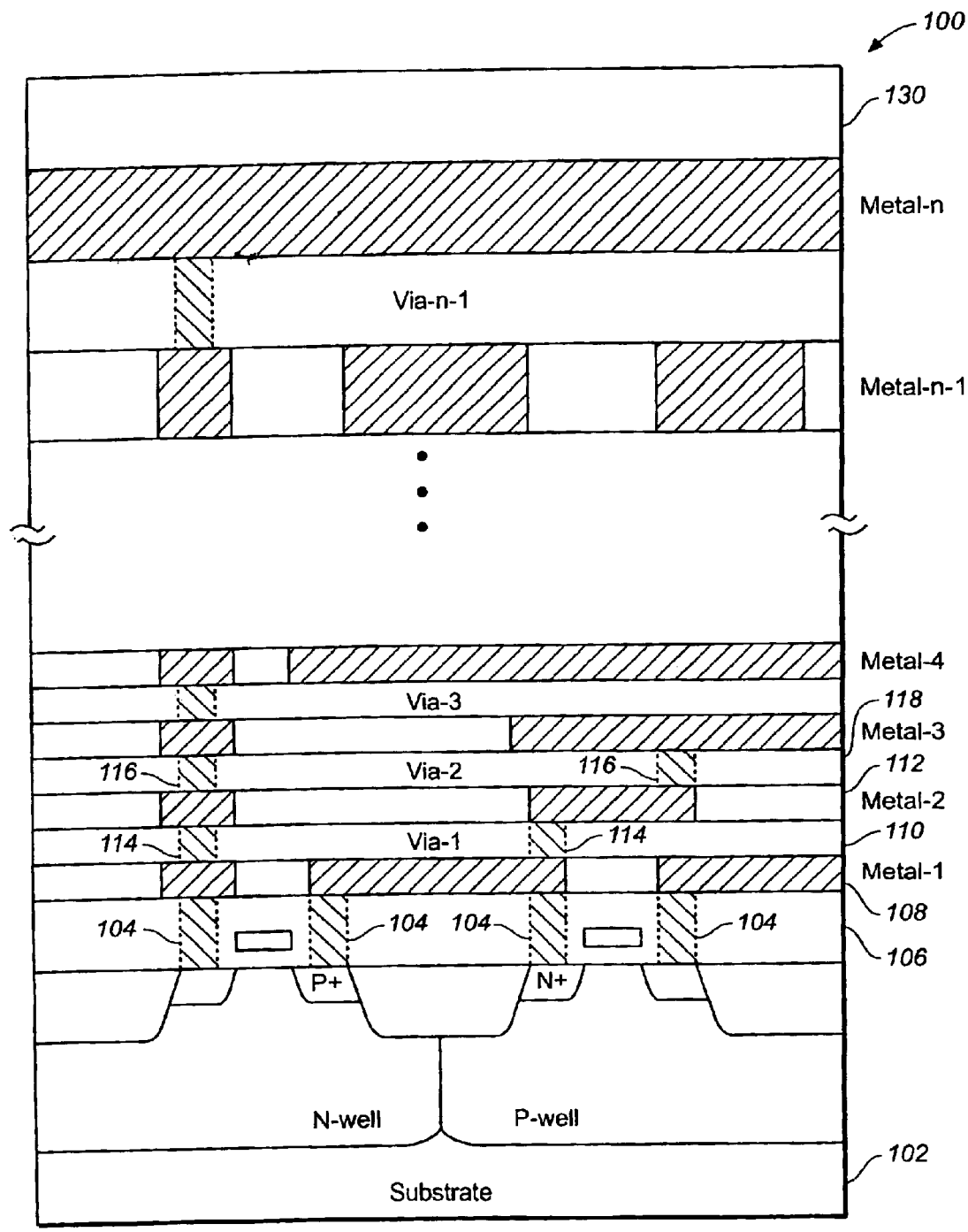
FIG._1

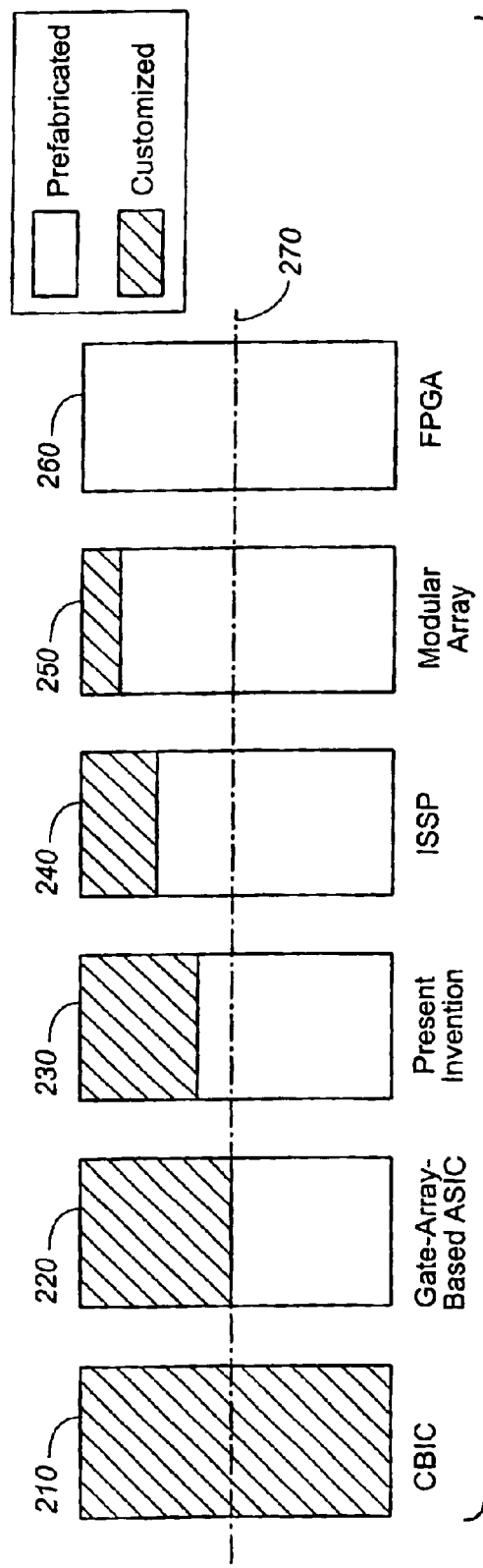
FIG._2
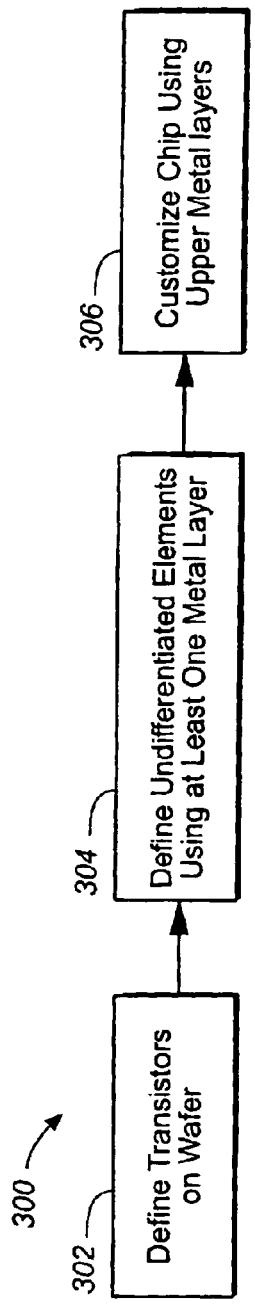
FIG._3

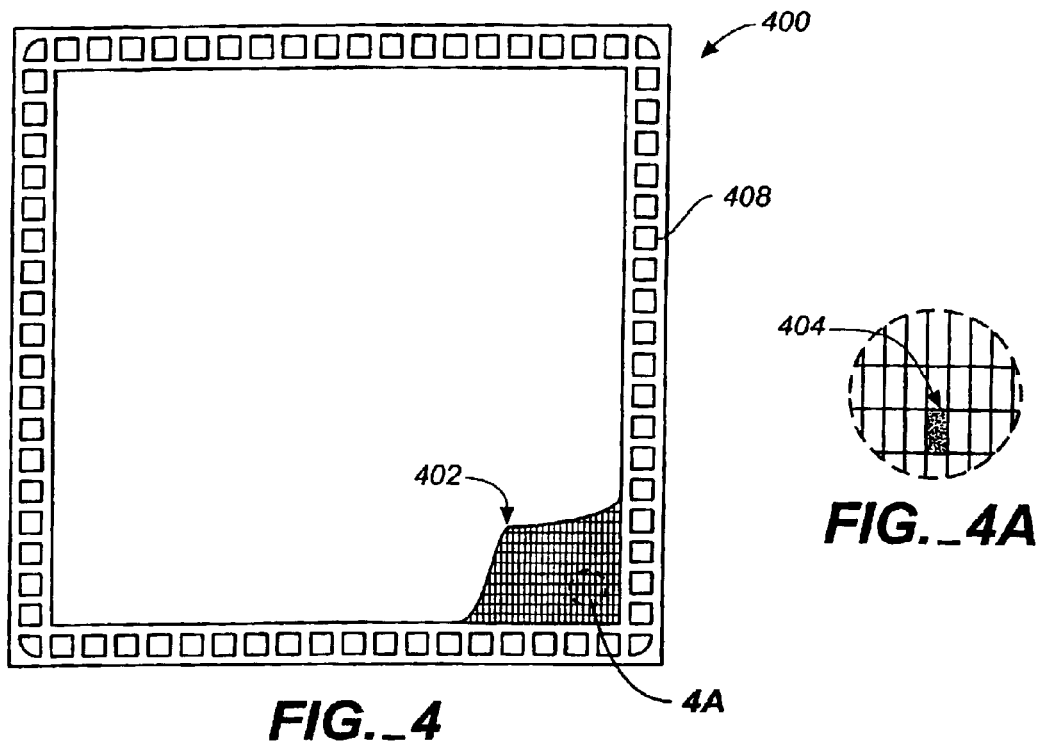
FIG._4
FIG._4A
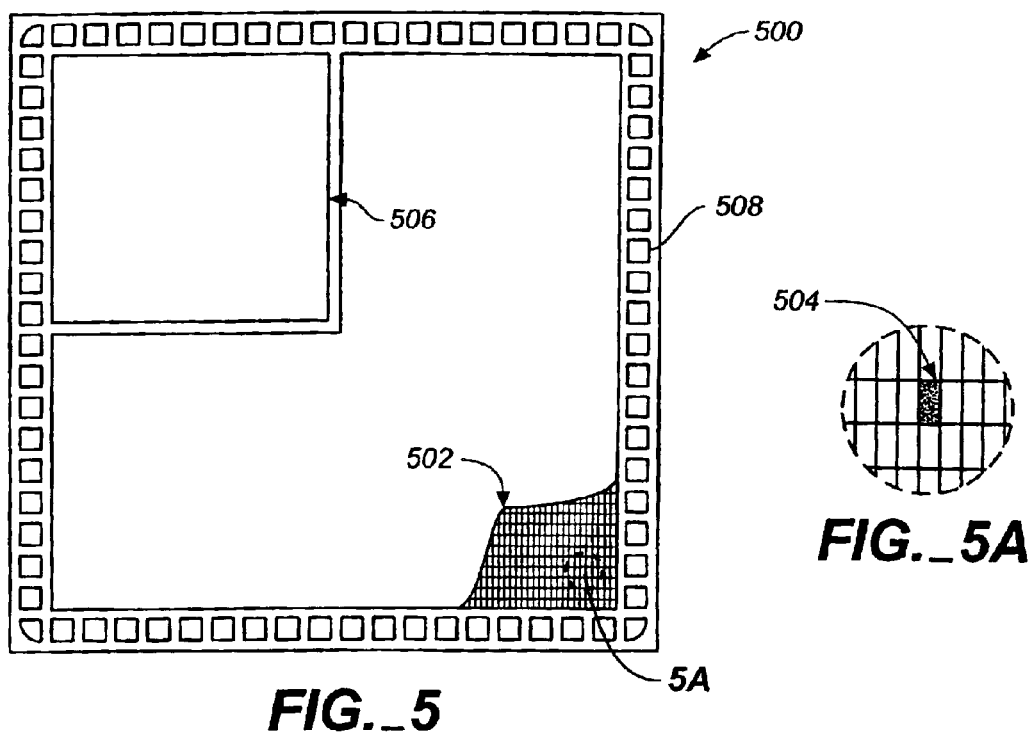
FIG._5
FIG._5A

ARCHITECTURE FOR MASK PROGRAMMABLE DEVICES

FIELD OF THE INVENTION

This invention relates generally to integrated circuits, and particularly to architecture for mask programmable devices.

BACKGROUND OF THE INVENTION

ICs (integrated circuits) are generally made on a thin and circular silicon wafer. The transistors and wiring of an IC are conventionally made from many mask layers built on top of one another. Each successive mask layer may have a pattern that is defined using a mask. A mask is the shape used for processing features in a particular process step of integrated circuit production. When a mask layer is defined using a mask chosen or provided by a customer, the mask layer is programmed or customized.

An ASIC (application specific integrated circuit) is an IC designed specifically for a particular application or use. There are three categories of ASICs in terms of programmability of mask layers: fully programmable ASICs, non-programmable ASICs, and semi-programmable ASICs. In a fully programmable ASIC, all mask layers are programmed or customized. A typical example of a fully programmable ASIC is a cell-based ASIC (CBIC). In a non-programmable ASIC, none of the mask layers are programmed or customized, and all mask layers are prefabricated by an ASIC vendor. A typical example of a non-programmable ASIC is a field-programmable gate array (FPGA). In a semi-programmable ASIC, some, but not all, mask layers are programmed. A typical example of a semi-programmable ASIC is a gate-array-based ASIC. Semi-programmable ASICs blending the performance found in the CBIC with the time-to-market provided by the FPGA are vigorously pursued by the ASIC vendor because such ASICs may reach out to a growing class of customers that are unwilling to pay for the CBIC but find the FPGA too constraining.

Conventionally, a metal layer of ASICs has been formed by blanket depositing a layer of metal on a substantially planar insulating surface. Portions of the metal layer are subsequently removed in an etching step to form the resulting metal conductors. Copper is preferred due to lower resistivity and better electromigration resistance. Unfortunately, copper may be difficult to etch in such a process. Traditional ASICs have therefore employed a more resistive metal, aluminum (or aluminum alloy), for the metal layers. For the metal inside contact holes and vias formed within the insulation layers, tungsten has been conventionally used.

Recently, a "damascene" process has been developed whereby copper may be used for the metal layers. Rather than blanket depositing metal on a substantially planar insulating substrate and then etching away parts of the metal layer to leave the conductors, trenches may be formed in an insulating material. A layer of metal may be blanket deposited over the entire surface of the insulating substrate such that the trenches are filled. Next, chemical or mechanical polishing may be used to planarize the integrated circuit surface and thereby polish away all the metal that is not in the trenches. The result may be metal conductors disposed in trenches. However, the copper process may cost significantly more than the traditional aluminum process.

Thus, it would be desirable to provide a semi-programmable ASIC using both copper (or copper alloy) and aluminum (or aluminum alloy) for the metal layers.

SUMMARY OF THE INVENTION

Accordingly, the present invention is directed to a semi-programmable ASIC using two metals for the metal layers. The semi-programmable ASIC may have a prefabricated first section and a customized second section. The prefabricated first section and the customized second section may each include one or more metal layers. The one or more metal layers included in the prefabricated first section may be used to define undifferentiated sets of electrical and logic elements. An undifferentiated set of electrical and logic elements may be a NAND logic gate, a NOR logic gate, or the like. The one or more metal layers included in the customized second section may be used to define logic functions of the undifferentiated sets of electrical and logic elements. The metal used in the one or more metal layers included in the prefabricated first section may be of one type such as copper, copper alloy, or the like, and the metal used in the metal layers included in the customized second section may be of another type such as aluminum, aluminum alloy, or the like.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 1 is a schematic diagram illustrating a partial cross-sectional view of an exemplary ASIC in which the present invention may be implemented;

FIG. 2 is a schematic diagram illustrating a cross-sectional view of exemplary ASICs with different number of customizable mask layers, wherein the height of a prefabricated or customized section is in proportion to the number of mask layers in that specific section;

FIG. 3 is a flow diagram showing an exemplary method for manufacturing an ASIC in accordance with the present invention;

FIG. 4 is a plan view of an exemplary sea-of-gates array die with no metal layers, on which the present invention may be implemented;

FIG. 4A is a magnified view of base cells shown in FIG. 4;

FIG. 5 is a plan view of an exemplary structured sea-of-gates array die with no metal layers, on which the present invention may be implemented; and FIG. 5A is a magnified view of base cells shown in FIG. 5.

DETAILED DESCRIPTION OF THE INVENTION

Reference will now be made in detail to the presently preferred embodiments of the invention, examples of which are illustrated in the accompanying drawings.

Referring first to FIG. 1, a schematic diagram illustrating a partial cross-sectional view of an exemplary ASIC 100 in which the present invention may be implemented is shown. The ASIC 100 may be formed on a semiconductor substrate 102. Those of ordinary skill in the art will understand that a number of masks may be used to form transistors which are the building block of logic gates. Such masks may include masks for forming buried layers and isolation (e.g., well structures), base diffusion, and emitter diffusion, masks for patterning gate electrodes, and the like. FIG. 1 shows two of such transistors.

After the transistors are formed, a contact layer 106 may be formed on top of the transistors by growth or deposition of insulating material. Contact holes 104 within the contact layer 106 may then be formed and metal such as tungsten may be deposited inside the contact holes 104. The contact layer 106 may be used to provide input and output connections to the transistors formed on the substrate 102.

After forming the contact holes 104, a metal layer 108 (Metal-1) may be deposited on top of the contact layer 106 and then patterned so that metal remains only in desired locations. Then an insulation layer 110 (Via-1) may be formed on top of the Metal-1 108. Next, vias 114 within the Via-1 110 may be formed, and metal such as tungsten may be deposited inside the vias 114. Then a metal layer 112 (Metal-2) may be deposited on top of the Via-1 110 and patterned so that metal remains only in desired locations. Next, an insulation layer (Via-2) 118 may be formed on top of the Metal-2 112. Next, vias 116 within the Via-2 118 may be formed, and metal such as tungsten may be deposited inside the vias 116. The process may be repeated for each metal layer and insulation layer required to be formed. As shown, the ASIC 100 may include n metal layers (Metal-1 to Metal-n), n−1 via layers (Via-1 to Via-n−1), and one contact layer. A surface passivation layer 130 may be formed on top of the top metal layer Metal-n.

Conventional semiconductor processes may use two conductors: aluminum (or aluminum alloy) for the metal layers (the Metal-1 108, the Metal-2 112, . . . , the Metal-n), and tungsten inside the contact holes 104 and the vias between two neighboring metal layers such as the vias 114, the vias 116, and the like. Because copper conducts electricity better than aluminum, and because aluminum interconnect tends to break when carrying a high current density, smaller chips that run at higher speeds than traditional designs may be developed when copper (or copper alloy) is used for the metal layers. However, since the copper process may cost significantly more than the traditional aluminum process, there is a need to use both copper (or copper alloy) and aluminum (or aluminum alloy) for the metal layers.

It is understood that FIG. 1 is intended as an example of an ASIC in which the present invention may be implemented and not as an architectural limitation to the present invention. Those of ordinary skill in the art will appreciate that various combinations and arrangements may be employed without departing from the scope and spirit of the present invention. For example, although FIG. 1 shows the metal layers formed by the traditional aluminum process, any metal layers shown in FIG. 1 may be alternatively formed by the copper process without departing from the scope and spirit of the present invention.

FIG. 2 is a schematic diagram illustrating a cross-sectional view of exemplary ASICs with different number of customizable mask layers, wherein the height of a prefabricated or customized section is in proportion to the number of mask layers in that specific section. A mask layer is customizable or programmable when the mask layer is capable of being formed using a mask which is chosen or provided by a customer. There are three categories of ASICs in terms of programmability of mask layers: fully programmable ASICs, non-programmable ASICs, and semi-programmable ASICs.

In a fully programmable ASIC, all mask layers are programmed or customized. A typical example of a fully programmable ASIC is a cell-based ASIC (CBIC) 210 shown in FIG. 2. The CBIC 210 may use pre-designed logic cells such as AND gates, OR gates, multiplexers, flip-flops, and the like, known as standard cells. The CBIC designer defines only the placement of the standard cells and the metal interconnect. The standard cells may be placed anywhere on the silicon. All the mask layers of the CBIC 210 may be customized and are unique to a particular customer. The advantage of CBICs may lie in the fact that designers save time, money, and reduce risk by using a pre-designed, pre-tested, and pre-characterized standard cell library. Additionally, each standard cell may be optimized individually. For example, during the design of the cell library, each transistor in every standard cell may be chosen to maximize speed or minimize area. On the other hand, the disadvantages may include the time delay and huge costs of designing or buying the standard-cell library, and the time needed to fabricate all mask layers of the CBIC for each new design.

In a non-programmable ASIC, none of the mask layers are programmed or customized. All mask layers are prefabricated by an ASIC vendor. A typical example is a field-programmable gate array (FPGA) 260 shown in FIG. 2. The FPGA 260 may be a chip that a system designer may program herself. An IC foundry may produce the FPGA 260 with some connections missing. The designer may perform design entry and simulation. Then, the designer may use special software to create a string of bits describing the extra connections required to make the desired design—the configuration file. Next, the designer may connect a computer to the chip and program the chip to make the necessary connections according to the configuration file. There may be no customization of any mask layers for the FPGA 260, allowing the FPGA 260 to be manufactured as a standard part in high volume. The FPGA 260 may have fast time-to-market since the FPGA 260 is relatively easy and quick to design and prototype. However, the FPGA 260 may have a relatively high cost per function. For example, the FPGA 260 with a capacity of one million gates may cost several thousand dollars. In addition, the FPGA 260 may be of low speed and dissipate a great deal of power.

In a semi-programmable ASIC, some, but not all, mask layers are programmed. A typical example of a semi-programmable ASIC is a gate-array-based ASIC 220 shown in FIG. 2. As shown in FIG. 2, the gate-array-based ASIC 220 may be divided into a first section which is below the line 270 and a second section which is above a line 270. The first section of the ASIC 220 may be prefabricated by an ASIC vendor and not programmable by the customer. For example, the first section of the ASIC 220 may be the section below the Metal-1 108 of the ASIC 100, as shown in FIG. 1. On the other hand, the second section of the ASIC 220 may be fully programmable. An example of the second section of the ASIC 220 may be the section above the contact layer 106 of the ASIC 100, as shown in FIG. 1.

In the gate-array-based ASIC 220, all the transistors are predefined on the silicon wafer. The predefined pattern of transistors on the gate-array-based ASIC 220 is the base array, and the smallest element that is replicated to make the base array is the base cell.

For example, a base cell may include four CMOS transistors: two n-channel transistors and two p-channel transistors. Only the mask layers above the base array are programmed. There are two kinds of gate-array-based ASICs: channeled arrays, and sea-of-gates (or channelless) arrays. Channeled and sea-of-gates arrays differ in one key aspect. In channeled arrays, strips of silicon are left vacant between rows of base cells for routing. On the other hand, there are no predefined areas set aside for routing between base cells on a sea-of-gates array.

A gate-array-based ASIC vendor may complete the diffusion steps that form the transistors and then put the pre-fabricated wafers (e.g., the first section of the ASIC 220 below the line 270) into inventory without any mask layers above the base array. Since only the layers above the base array (e.g., the second section of the ASIC 220 above the line 270) are unique to the gate-array-based ASIC 220, the vendor may use the stockpiled wafers for different customers as needed. Using these pre-fabricated wafers may thus reduce the time needed to make the gate-array-based ASIC 220 compared to the CBIC 210. Moreover, since the costs for all the initial fabrication steps for the gate-array-based ASIC 220 are shared for each customer, the total cost of the gate-array-based ASIC 220 may be reduced compared to the CBIC 210. However, since all the transistors are predefined on the silicon wafer, the gate-array-based ASIC 220 may lack density, performance, and flexibility provided by the CBIC 210.

Semi-programmable ASICs blending the performance found in the CBIC 210 with the time-to-market provided by the FPGA 260 are vigorously pursued by ASIC vendors because such ASICs may reach out to a growing class of customers that are unwilling to pay for the CBIC 210 but find the FPGA 260 too constraining. For example, a Modular Array 250 (FIG. 2) has been developed in which the uppermost metal layer of a semi-programmable ASIC (and possibly the uppermost via layer) may be customizable, and all underlying mask layers may be prefabricated. The basic building block in the Modular Array 250 may be the module or function block, which is significantly more complicated than a NAND gate typically found in sea-of-gates arrays and is suitable for implementing fairly complex functions (see, e.g., U.S. Pat. No. 6,242,767). NEC has also introduced an Instant Silicon Solution Platform (ISSP) 240 (FIG. 2), which is a semi-programmable ASIC having five metal layers (aluminum): the uppermost two metal layers and the uppermost via layer are customizable, and all underlying mask layers are prefabricated. NEC's ISSP 240 also uses a fairly complex logic cell with both combinatorial and sequential elements, which is more complex than a sea-of-gates array. However, since the Modular Array 250 and the ISSP 240 use complex logic cells as the basic building block, the functionality and performance of the Modular Array 250 and the ISSP 240 may be limited.

The present invention is directed to an ASIC 230 (FIG. 2) that has a prefabricated first section and a customized second section. The prefabricated first section of the ASIC 230 may include one or more metal layers and all underlying mask layers. For example, the prefabricated first section may include the Metal-1 108 and all underlying mask layers of the ASIC 100, and the customized second section may include the Via-1 110 and all overlying mask layers, as shown in FIG. 1. Alternatively, the prefabricated first section may include the Metal-2 112 and all underlying mask layers of the ASIC 100, and the customized second section may include the Via-2 118 and all overlying mask layers, as shown in FIG. 1. It is appreciated that the prefabricated first section may also include other metal layers, as may be contemplated by a person of ordinary skill in the art.

According to an aspect of the present invention, the prefabricated first section may include undifferentiated sets of electrical and logic elements. An undifferentiated set of electrical and logic elements may be a NAND logic gate, a NOR logic gate, or the like. The undifferentiated sets of electrical and logic elements may be given the final function solely by manipulating the topology of the customized second section. Since the ASIC 230 uses an undifferentiated set of electrical and logic elements as a building block, the functionality and performance may be greatly improved compared with the ISSP 240 and the Modular Array 250. Furthermore, since the ASIC 230 has at least one metal layer prefabricated by an ASIC vendor, the manufacture of the customized section of the ASIC 230 may take less time and cost less than the manufacture of the customized section of the gate-array-based ASIC 220 which has no metal layer prefabricated.

According to another aspect of the present invention, the one or more metal layers included in the prefabricated first section of the ASIC 230 may use a first metal (e.g., copper, copper alloy, or the like), and the one or more metal layers included in the customized second section of the ASIC 230 may utilize a second metal (e.g., aluminum, aluminum alloy, or the like). Employing such a dual-metal interconnect structure, the ASIC 230 may be designed so that the partitioning of functions allows the higher performance signal paths to occupy the prefabricated metal layer or layers (e.g., copper, copper alloy, or the like), and the lower performance signal paths to occupy the customized metal layer or layers (e.g., aluminum, aluminum alloy, or the like).

It is understood that the one or more metal layers included in the prefabricated first section of the ASIC 230 may also utilize aluminum, aluminum alloy, or the like without departing from the scope and spirit of the present invention. It is also understood that the one or more metal layers included in the customized second section of the ASIC 230 may also utilize copper, copper, or the like without departing from the scope and spirit of the present invention.

It is understood that FIG. 2 is intended as a schematic diagram illustrating a cross-sectional view of exemplary ASICs with different number of customizable mask layers and not as an architectural limitation to the present invention. For example, although FIG. 2 shows the ASIC 230 in accordance with the present invention has a fewer number of prefabricated mask layers than the ISSP 240 and the Modular Array 250, this is not necessarily so. Those of ordinary skill in the art will appreciate that other embodiments of the present invention may be employed without departing from the scope and spirit of the present invention.

FIG. 3 is a flow diagram showing an exemplary method 300 for manufacturing an ASIC in accordance with the present invention. The method 300 starts with step 302 in which transistors may be defined on a silicon wafer. Then, in step 304, at least one metal layer may be utilized to define the underlying transistors as undifferentiated sets of electrical and logic elements. An undifferentiated set of electrical and logic element may be a NAND logic gate, a NOR logic gate, or the like. The metal utilized to form the at least one metal layer may be copper, copper alloy, aluminum, aluminum alloy, or the like. Next, the ASIC may be customized, i.e., the undifferentiated sets of electrical and logic elements may be given the final functional definition, by utilizing upper metal layers in step 306. The metal utilized to form the upper metal layers may be aluminum, aluminum alloy, copper, copper alloy, or the like. It is appreciated that the step 304 and the step 306 may be performed at different time and locations. For example, at least one copper layer may be formed in a state of the art IC foundry in the step 304, and then the chip may be shipped to a different IC foundry and be finished with at least one aluminum layer by old equipment in the step 306.

FIG. 4 is a plan view of an exemplary sea-of-gates array die 400 with no metal layers, on which the present invention may be implemented. The sea-of-gates array die 400 may include a base array 402 of base cells (not all are shown in FIG. 4) in the core area of the die 400, and bonding pads 408 around the edge of the die 400 for connecting to the pins of the ASIC package. FIG. 4A is a magnified view of base cells shown in FIG. 4. The base array 402 is a predefined pattern of transistors on the die 400, and a base cell 404 is the smallest element that is replicated to make the base array 402. For example, the base cell 404 may include four CMOS transistors: two n-channel transistors and two p-channel transistors.

Later, metal layers may be formed over the base array 402 for interconnect purposes. According to one aspect of the present invention, at least one metal layer may be prefabricated to connect the transistors within the base cell 404 into an undifferentiated set of electrical and logic elements such as a NAND logic gate, a NOR logic gate, or the like. According to another aspect of the present invention, the metal used in the one or more metal layers to define an undifferentiated set of electrical and logic elements may be of a first type (e.g., copper, copper alloy, or the like), and the metal used in other metal layers may be of a second type (e.g., aluminum, aluminum alloy, or the like). It is understood that the other metal layers may alternatively utilize copper, copper alloy, or the like without departing from the scope and spirit of the present invention.

FIG. 5 is a plan view of an exemplary structured sea-of-gates array die 500 with no metal layers, on which the present invention may be implemented. The structured sea-of-gates array die 500 may include an embedded block 506 in the upper left corner, a base array 502 of base cells (not all are shown in FIG. 5) in the rest of the die 500, and bonding pads 508 around the edge of the die 500 for connecting to the pins of the ASIC package. The embedded block 506 may be a RAM, a ROM, a CPU, an I/O unit, a clock/timing unit, or like. It is understood that the die 500 may include more than one embedded block. In addition, the locations of the embedded blocks on the die 500 may be arranged as contemplated by a person of ordinary skill in the art without departing from the scope and spirit of the present invention. FIG. 5A is a magnified view of base cells shown in FIG. 5. The base array 502 is a predefined pattern of transistors on the die 500, and a base cell 504 is the smallest element that is replicated to make the base array 502. For example, the base cell 504 may include four CMOS transistors: two n-channel transistors and two p-channel transistors.

Later, metal layers may be formed over the base array 502 for interconnect purposes. According to one aspect of the present invention, at least one metal layer may be prefabricated to connect the transistors within the base cell 504 into an undifferentiated set of electrical and logic elements such as a NAND logic gate, a NOR logic gate, or the like. According to another aspect of the present invention, the metal used in the one or more metal layers to define an undifferentiated set of electrical and logic elements may be of a first type (e.g., copper, copper alloy, or the like), and the metal used in other metal layers may be of a second type (e.g., aluminum, aluminum alloy, or the like). It is understood that the other metal layers may alternatively utilize copper, copper alloy, or the like without departing from the scope and spirit of the present invention.

The present invention may have the following advantages. First, the lower prefabricated section, which may be prepared in large volumes under heavily controlled conditions in order to assure high yields despite many critical process steps, may be optimized to offer inherent high performance within the undifferentiated set of electrical and logic elements, without risk to production schedules or yields of the final product. At the same time, the expense of a manufacturing facility for producing the final product, which may be created by adding the final metal layer or layers, may be greatly reduced by making these process steps less critical and thus less costly to implement. Additionally, the lower prefabricated section, which may include one or more metal layers made of aluminum, may be made in one IC foundry, and then the lower prefabricated section may be shipped to another IC foundry to add the more costly metal layers made of copper.

It is appreciated that the present invention is not limited to an ASIC. The present invention may also apply to a semiconductor chip in general.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A semiconductor device, comprising:
    an array of base cells formed with a substrate;
    at least one prefabricated metal layer formed over said array, said at least one prefabricated metal layer defining said base cells into undifferentiated sets of electrical and logic elements; and
    at least one customized metal layer formed over said at least one prefabricated metal layer, said at least one customized metal layer defining logic function of said undifferentiated sets of electrical and logic elements.

2. The semiconductor device of claim 1, wherein said at least one prefabricated metal layer is made of a first metal, and said at least one customized metal layer is made of a second metal.

3. The semiconductor device of claim 2, wherein said first metal is selected from the group consisting of copper and copper alloy.

4. The semiconductor device of claim 3, wherein said second metal is selected from the group consisting of aluminum and aluminum alloy.

5. The semiconductor device of claim 3, wherein said second metal is selected from the group consisting of copper and copper alloy.

6. The semiconductor device of claim 1, wherein said undifferentiated sets of electrical and logic elements are NAND gates.

7. The semiconductor device of claim 1, wherein said undifferentiated sets of electrical and logic elements are NOR gates.

8. The semiconductor device of claim 1, wherein said array of base cells is a sea-of-gates array.

9. The semiconductor device of claim 1, wherein said array of base cells is a structured sea-of-gates array.

10. An ASIC chip, comprising:
   an array of base cells formed with a substrate;
   at least one prefabricated metal layer formed over said array, said at least one prefabricated metal layer defining said base cells into undifferentiated sets of electrical and logic elements; and
   at least one customized metal layer formed over said at least one prefabricated metal layer, said at least one customized metal layer defining logic function of said undifferentiated sets of electrical and logic elements.

11. The ASIC chip of claim 10, wherein said at least one prefabricated metal layer is made of a first metal, and said at least one customized metal layer is made of a second metal.

12. The ASIC chip of claim 11, wherein said first metal is selected from the group consisting of copper and copper alloy.

13. The ASIC chip of claim 12, wherein said second metal is selected from the group consisting of aluminum and aluminum alloy.

14. The ASIC chip of claim 12, wherein said second metal is selected from the group consisting of copper and copper alloy.

15. The ASIC chip of claim 10, wherein said undifferentiated sets of electrical and logic elements are NAND gates.

16. The ASIC chip of claim 10, wherein said undifferentiated sets of electrical and logic elements are NOR gates.

17. The ASIC chip of claim 10, wherein said array of base cells is a sea-of-gates array.

18. The ASIC chip of claim 10, wherein said array of base cells is a structured sea-of-gates array.

* * * * *